(12) United States Patent
Choi et al.

(10) Patent No.: US 11,361,803 B2
(45) Date of Patent: Jun. 14, 2022

(54) MEMORY DEVICE AND OPERATING METHOD OF THE MEMORY DEVICE

(71) Applicant: SK hynix Inc., Icheon-si (KR)

(72) Inventors: Won Jae Choi, Icheon-si (KR); Gwan Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 100 days.

(21) Appl. No.: 16/892,821

(22) Filed: Jun. 4, 2020

(65) Prior Publication Data

US 2021/0118479 A1 Apr. 22, 2021

(30) Foreign Application Priority Data

Oct. 18, 2019 (KR) .................. 10-2019-0130172

(51) Int. Cl.
*G06F 12/08* (2016.01)
*G11C 7/22* (2006.01)
*G11C 7/10* (2006.01)
*G11C 16/26* (2006.01)
*G11C 16/10* (2006.01)

(52) U.S. Cl.
CPC ........... *G11C 7/222* (2013.01); *G11C 7/1006* (2013.01); *G11C 7/1045* (2013.01); *G11C 16/10* (2013.01); *G11C 16/26* (2013.01)

(58) Field of Classification Search
CPC ...................................................... G06F 12/08
USPC ...................................................... 365/49.16
See application file for complete search history.

(56) References Cited

U.S. PATENT DOCUMENTS

2017/0309338 A1 10/2017 Shah et al.
2019/0172537 A1* 6/2019 Peddle .................... G06F 12/08

FOREIGN PATENT DOCUMENTS

| KR | 1020070114507 A | 12/2007 |
| KR | 100794659 B1 | 1/2008 |
| KR | 100890017 B1 | 3/2009 |
| KR | 1020110031907 A | 3/2011 |

* cited by examiner

*Primary Examiner* — Jason Lappas
(74) *Attorney, Agent, or Firm* — William Park & Associates Ltd.

(57) ABSTRACT

A memory device includes a plurality of memory cell arrays each configured to include a plurality of memory cells, a plurality of peripheral circuits each configured to perform operations on the plurality of memory cell arrays, a plurality of control logics configured to control the plurality of peripheral circuits, and a control logic selector configured to activate at least one control logic among the plurality of control logics according to a type of a command received from the memory controller.

20 Claims, 15 Drawing Sheets

FIG. 4
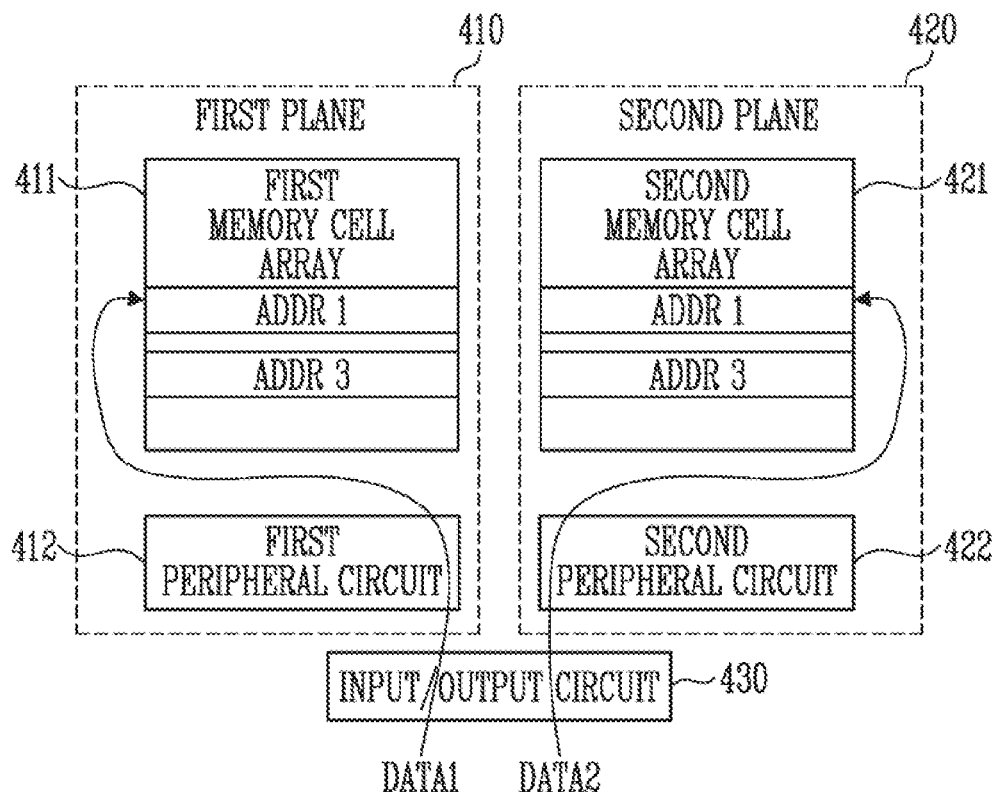
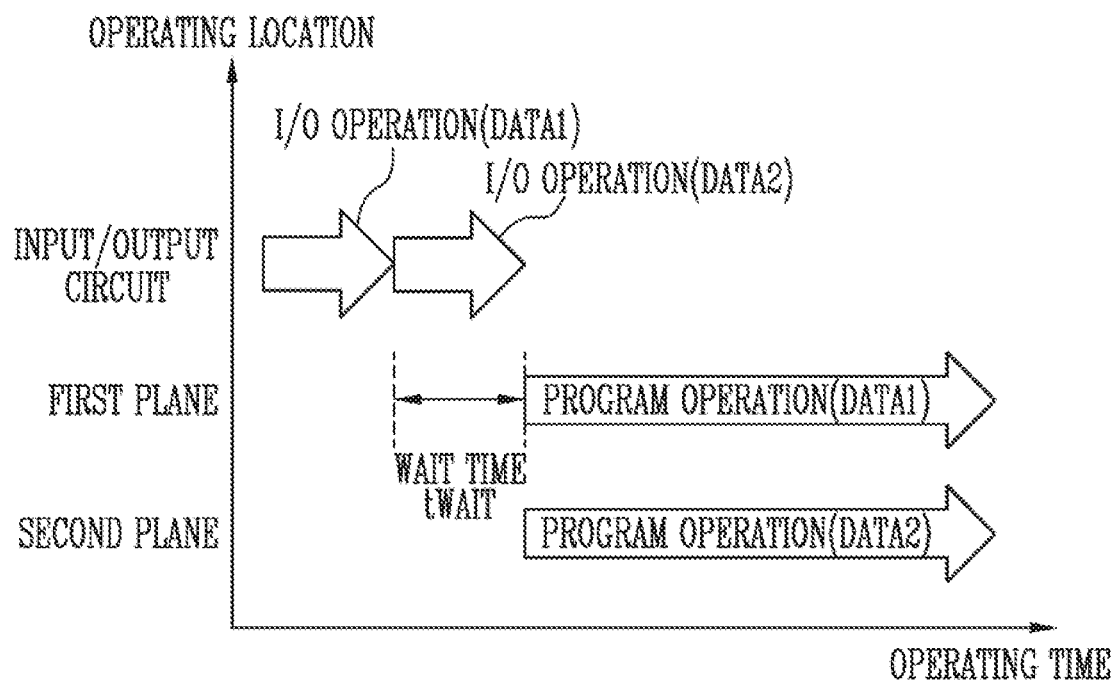

FIG. 5
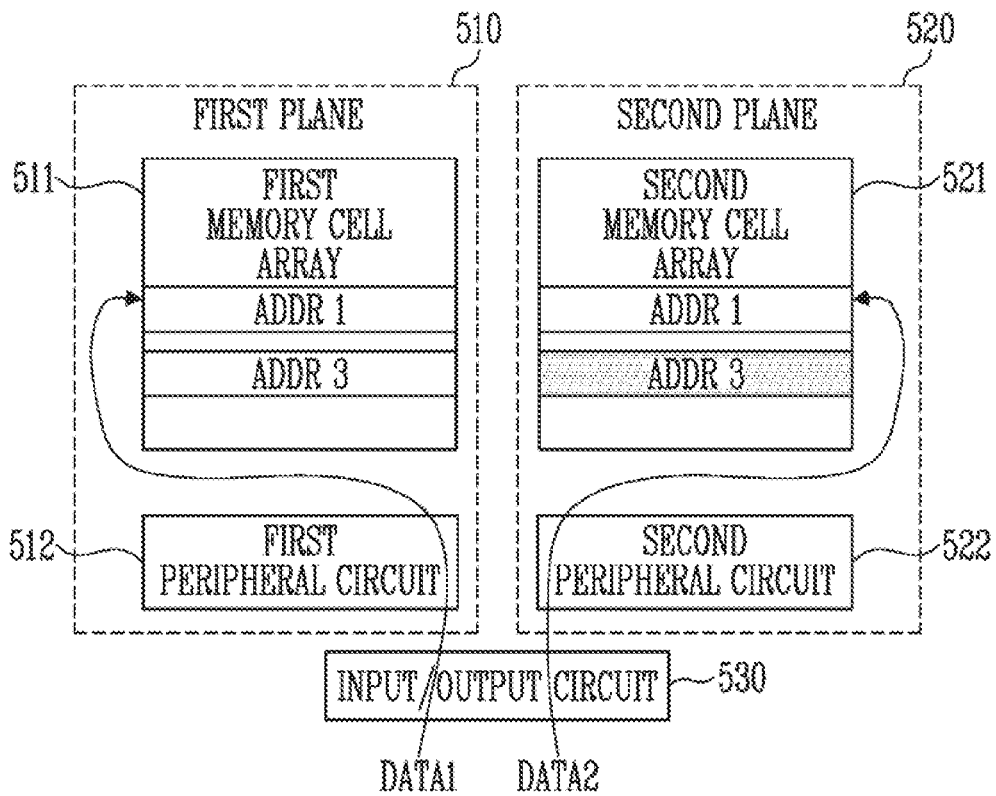
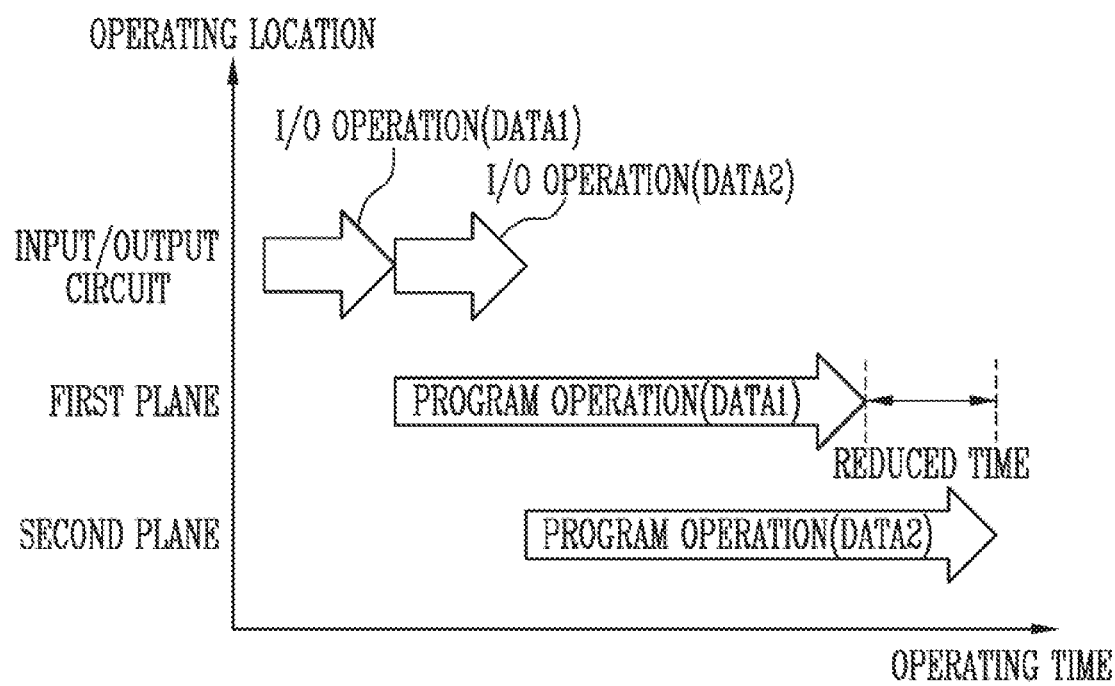

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2019-0130172 filed on Oct. 18, 2019, in the Korean Intellectual Property Office, the entire disclosure of which is incorporated herein by reference.

BACKGROUND

1. Technical Field

Various embodiments relate generally to an electronic device and, more particularly, to a semiconductor device and an operating method of the semiconductor device.

2. Related Art

A storage device may store data in response to control of a host device such as a computer or a smartphone. The storage device may include a memory device storing data and a memory controller controlling the memory device. Memory devices may be divided into volatile memory devices and non-volatile memory devices.

A volatile memory device may retain data as long as power is being supplied, and may lose the stored data in the absence of power supply. Types of the volatile memory devices may include Static Random Access Memory (SRAM), Dynamic Random Access Memory (DRAM), and the like.

A non-volatile memory device might not lose data even in the absence of power supply. Types of the non-volatile memory devices may include Read Only Memory (ROM), Programmable ROM (PROM), Electrically Programmable ROM (EPROM), Electrically Erasable and Programmable ROM (EEPROM) and flash memory.

SUMMARY

According to an embodiment, a memory device may include a plurality of memory cell arrays each configured to include a plurality of memory cells, a plurality of peripheral circuits each configured to perform operations on the plurality of memory cell arrays, a plurality of control logics configured to control the plurality of peripheral circuits, and a control logic selector configured activating at least one control logic among the plurality of control logics according to a type of a command received from the memory controller.

According to an embodiment, a method of operating a memory device including a plurality of peripheral circuits controlling a plurality of memory cell arrays may include determining a type of a command received from a host, and selectively activating a plurality of control logics controlling the plurality of peripheral circuits on the basis of the type of the command.

BRIEF DESCRIPTION OF THE DRAWINGS

FIG. 4 is a diagram illustrating a program operation in a multi-plane scheme;
FIG. 5 is a diagram illustrating a program operation in a plane interleaving scheme.

DETAILED DESCRIPTION

Structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Hereinafter, examples of embodiments of the present disclosure will be described with reference to the accompanying drawings in order for those skilled in the art to be able to readily implement the technical spirit of the present disclosure.

Various embodiments may be directed to a memory device having improved current consumption management and an operating method thereof.

Figure 1:
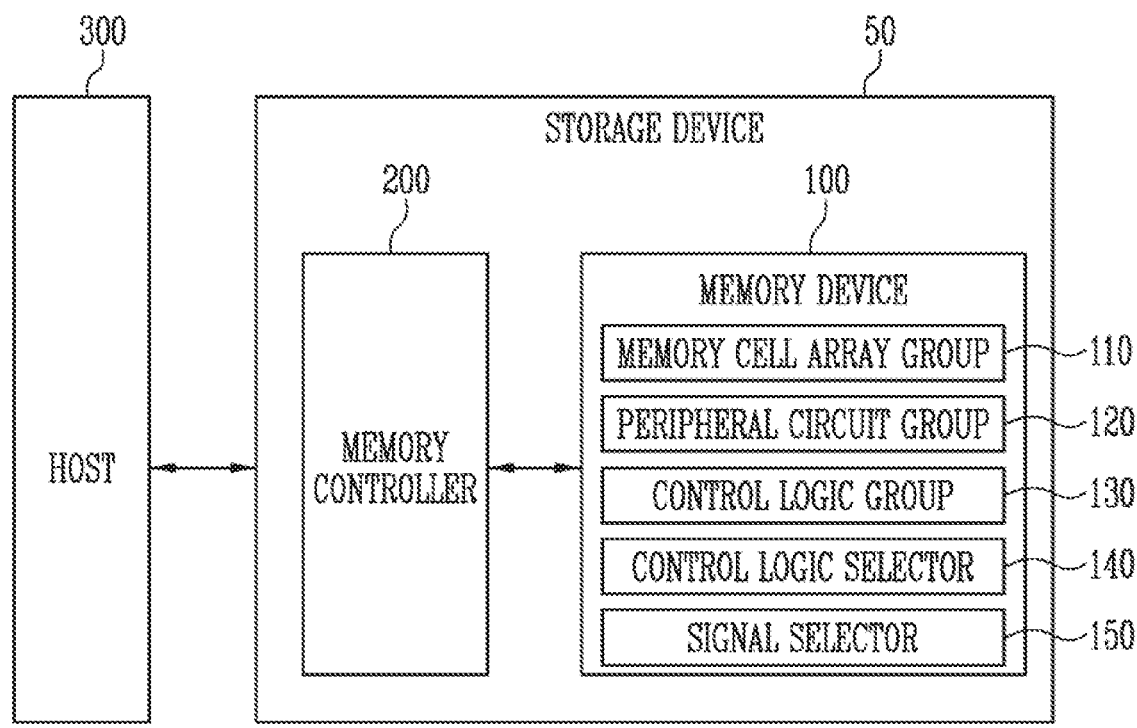
FIG. 1 is a block diagram illustrating a storage device.

FIG. 1 is a block diagram illustrating a storage device 50.

Referring to FIG. 1, the storage device 50 may include a memory device 100 and a memory controller 200 controlling operations of the memory device 100.

The storage device 50 may be configured to store data in response to control of a host 300. Examples of the storage device 50 may include a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface corresponding to a communication method with the host 300. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and the like.

The storage device 50 may be manufactured by any one of various types of packages. For example, the storage device 50 may be manufactured as any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate in response to control of the memory controller 200. The memory device 100 may include a memory cell array group 110. The memory cell array group 110 may include a plurality of memory cell arrays. Each of the plurality of memory cell arrays may include a plurality of memory cells storing data.

Each of the memory cells may be a single level cell (SLC) storing one data bit, a multi-level cell (MLC) staring two data bits, a triple level cell (TLC) storing three data bits, or a quad level cell (QLC) storing four data bits.

The memory cell array may include a plurality of memory blocks. Each of the memory blocks may include a plurality of memory cells. Each memory block may include a plurality of pages. According to an embodiment, a page may be a unit for storing data in the memory device 100 or reading data stored in the memory device 100. The memory block may be a unit for erasing data.

In an embodiment, examples of the memory device 100 may include a Double Data Rate Synchronous Dynamic Random Access Memory (DDR SDRAM), a Low Power Double Data Rate4 (LPDDR4) SDRAM, a Graphics Double Data Rate (GDDR) SDRAM, a Low Power DDR (LPDDR) SDRAM, a Rambus Dynamic Random Access Memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). For convenience of explanation, it is assumed that the memory device 100 is a NAND flash memory.

The memory device 100 may include a peripheral circuit group 120. The peripheral circuit group 120 may include a plurality of peripheral circuits. Each of the plurality of peripheral circuits may perform a program, read, or erase operation on memory blocks or pages included in a plurality of memory cell arrays. For example, the peripheral circuit may apply an operating voltage to a word line coupled to a memory cell array and apply a program permission voltage and a program inhibition voltage to a bit line coupled to the memory cell array. The peripheral circuit may perform an operation in response to control of the control logic.

The memory device 100 may include control logic. A control logic group 130 may include pluralities of various control logics. The control logic may be implemented as hardware, software, or a combination of hardware and software. For example, the control logic may be a control logic circuit operating in accordance with an algorithm and/or a processor executing control logic code. A control logic group 130 may be implemented as hardware, software, or a combination of hardware and software. For example, the control logic group 130 may include a plurality of control logic circuits operating in accordance with an algorithm and/or a processor executing the control logic code.

The control logic may receive a command, an address and data from the memory controller 200 and generate a control signal to perform a program operation, a read operation, or an erase operation corresponding to the command. The control logic may transfer the control signal to the peripheral circuit to perform an operation corresponding to the command.

The plurality of control logics included in the control logic group 130 may control the plurality of peripheral circuits included in the peripheral circuit group 120. The control logic group 130 may include common control logic and individual control logics. The common control logic may be implemented as hardware, software, or a combination of hardware and software. For example, the common control logic may be a common control logic circuit operating in accordance with an algorithm and/or a processor executing control logic code. The individual control logics may be implemented as hardware, software, or a combination of hardware and software. For example, the individual control logic may be an individual control logic circuit operating in accordance with an algorithm and/or a processor executing control logic code.

The common control logic may generate a common control signal commonly transferred to the plurality of peripheral circuits included in the peripheral circuit group 120. The plurality of peripheral circuits having received the common control signal may perform an operation corresponding to the command on the plurality of memory cell arrays included in the memory cell array group 110. Therefore, the common control logic may control the peripheral circuit group 120 so that operations may be performed on the plurality of memory cell arrays at the same time. For example, the common control logic may control the plurality of peripheral circuits so that the plurality of memory cell arrays may simultaneously operate in a multi-plane manner.

The individual control logic may generate an individual control signal that is transferred to one peripheral circuit selected from among the plurality of peripheral circuits included in the peripheral circuit group 120. The individual control logic may transfer the generated individual control signal to one peripheral circuit. Therefore, the individual control logic may control the peripheral circuit so that a program, read, or erase operation may be performed on one of the plurality of memory cell arrays included in the memory cell array group 110. Therefore, the peripheral circuits controlled by the plurality of individual control logics may be individually operated. The individual control logics may control the plurality of peripheral circuits so that the plurality of memory cell arrays may individually operate in a plane interleaving manner.

The memory device 100 may include a control logic selector 140. The control logic selector 140 may receive a command from the memory controller 200 and select a control logic for controlling an operation corresponding to the received command. For example, the control logic selector 140 may selectively activate the common control logic and the individual control logics depending on a type of the received command. For example, after the control logic selector 140 receives a command for instructing a multi-plane operation, the control logic selector 140 may activate the common control logic and deactivate the individual control logics. Alternatively, after the control logic selector 140 receives a command for instructing a plane interleaving operation, the control logic selector 140 may activate the common control logic and the individual control logics. The control logic selector 140 may deactivate the individual control logics by power gating or clock gating.

The power gating may be a technique for blocking power supply to a control logic which is not used in a program operation, a read operation, or an erase operation in response to a gating control signal. The clock gating may be a technique for blocking power supply to a control logic which is not used in a program operation, a read operation, or an erase operation in response to a gating control signal.

The memory device 100 may reduce current consumption caused by an individual control logic which is not used by selectively activating the individual control logics according to the type of the command.

The memory device 100 may include a signal selector 150. The signal selector 150 may selectively provide the peripheral circuit with the common control signal generated by the common control logic to control the peripheral circuit and the individual control signal generated by the individual control logic to control the peripheral circuit. The signal selector 150 may select the common control signal and the individual control signal in response to a select signal received from the control logic selector 140. When both the common control logic and the individual control logic are activated, the signal selector 150 may select either the common control signal or the individual control signal and provide the selected control signal to the peripheral circuit.

The memory device 100 may receive a command and an address from the memory controller 200. The memory device 100 may be configured to access a selected area in the memory cell array in response to the received address. When the memory device 100 accesses the selected area, it may mean that the memory device 100 may perform an operation corresponding to the command on the area selected by the address. For example, the memory device 100 may perform a write operation (program operation), a read operation, and an erase operation. During a program operation, the memory device 100 may program the area selected by the address with data. During a read operation, the memory device 100 may read data from the area selected by the address. During an erase operation, the memory device 100 may erase data from the area selected by the address.

When power is applied to the storage device 50, the memory controller 200 may execute firmware FW. The firmware FW may include a host interface layer HIL receiving a request input from the host 300 or outputting a response to the host 300, a flash translation layer FTL managing operations between an interface of the host 300 and an interface of the memory device 100, and a flash interface layer FIL providing a command to the memory device 100 or receiving a response from the memory device 100.

The memory controller 200 may receive data and a logical address LA from the host 300 and convert the logical address LA into a physical address PA indicating an address of memory cells where the data in the memory device 100 is stored. The logical address LA may be a logical block address LBA and the physical address PA may be a physical block address PBA.

The memory controller 200 may control the memory device 100 so that a program operation, a read operation or an erase operation may be performed in response to a request from the host 300. During a program operation, the memory controller 200 may provide a program command, a physical block address and data to the memory device 100. During a read operation, the memory controller 200 may provide a read command and a physical block address to the memory device 100. During an erase operation, the memory controller 200 may provide an erase command, a physical block address, and data to the memory device 100.

The memory controller 200 may control the memory device 100 so that a program operation, a read operation or an erase operation may be performed regardless of the request from the host 300. For example, the memory controller 200 may control the memory device 100 to perform a program operation, a read operation, or an erase operation used to perform background operations such as wear leveling, garbage collection and read reclaim.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
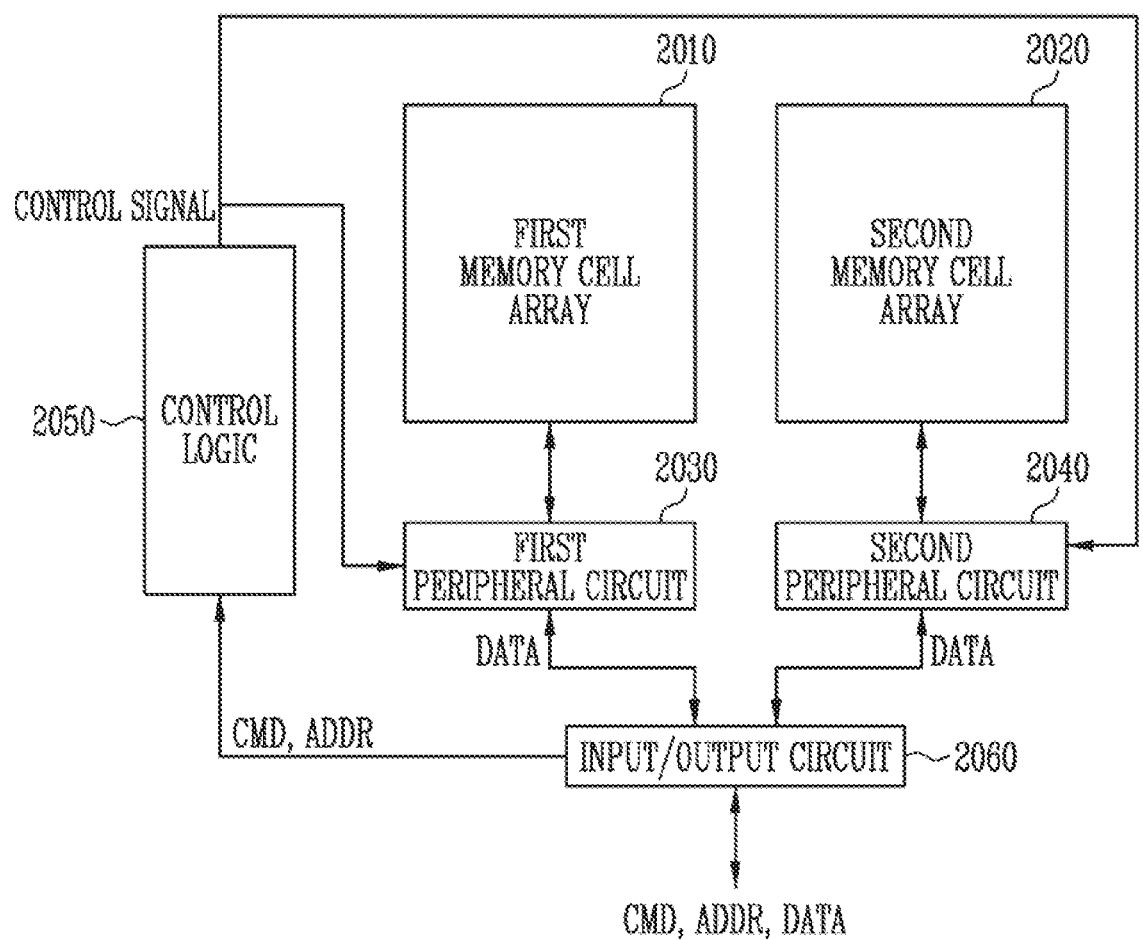
FIG. 2 is a diagram illustrating a multi-plane operation.

FIG. 2 is a diagram illustrating a multi-plane operation.

Referring to FIG. 2, a memory device 100_2 may include a first memory cell array 2010, a second memory cell array 2020, a first peripheral circuit 2030, a second peripheral circuit 2040, control logic 2050, and an input/output circuit 2060. The control logic 2050 may be implemented as hardware, software, or a combination of hardware and software. For example, the control logic 2050 may be a control logic circuit operating in accordance with an algorithm and/or a processor executing control logic code.

The input/output circuit 2060 may receive a command, an address and data from the memory controller 200. The input/output circuit 2060 may transfer the data to the first peripheral circuit 2030 and the second peripheral circuit 2040. The input/output circuit 2060 may transfer data from the first peripheral circuit 2030 and the second peripheral circuit 2040. The input/output circuit 2060 may transfer the data from the first peripheral circuit 2030 and the second peripheral circuit 2040 to the memory controller 200. The input/output circuit 2060 may transfer the command and the address to the control logic 2050. The input/output circuit 2060 may receive first data to be stored in the first memory cell array 2010 and second data to be stored in the second memory cell array 2020 from the memory controller 200 in a sequential manner. In other words, after the input/output circuit 2060 receives the first data from the memory controller 200 and transfers the received first data to the first peripheral circuit 2030, the input/output circuit 2060 may receive the second data from the memory controller 200 and transfer the received second data to the second peripheral circuit 2040.

The control logic 2050 may receive the command and the address from the input/output circuit 2060 and generate a control signal for controlling the first peripheral circuit 2030 and the second peripheral circuit 2040 to perform operations corresponding to the command on an area corresponding to the address. The control logic 2050 may transfer a control signal to the first peripheral circuit 2030 and the second peripheral circuit 2040 at the same time.

The first peripheral circuit 2030 and the second peripheral circuit 2040 may commonly receive the control signal from the control logic 2050. The first peripheral circuit 2030 and the second peripheral circuit 2040 may simultaneously perform the operations corresponding to the command based on the control signal commonly received from the control logic 2050. For example, the first peripheral circuit 2030 and the second peripheral circuit 2040 may simultaneously program the memory cell arrays with the data from the input/output circuit 2060. The first peripheral circuit 2030 and the second peripheral circuit 2040 may read data from the first memory cell array 2010 and the second memory cell array 2020, respectively. The first peripheral circuit 2030 and the second peripheral circuit 2040 may erase data stored in the first memory cell array 2010 and the second memory cell array 2020 at the same time.

A method of simultaneously controlling a plurality of peripheral circuits using one control logic may be referred to as a multi-plane scheme. When one control logic reads data stored in a plurality of memory cell arrays on the basis of the received address, the data may be read from the same areas in the plurality of memory cell arrays. As a result, random read performance of reading data from a random area may be deteriorated.

Figure 3:
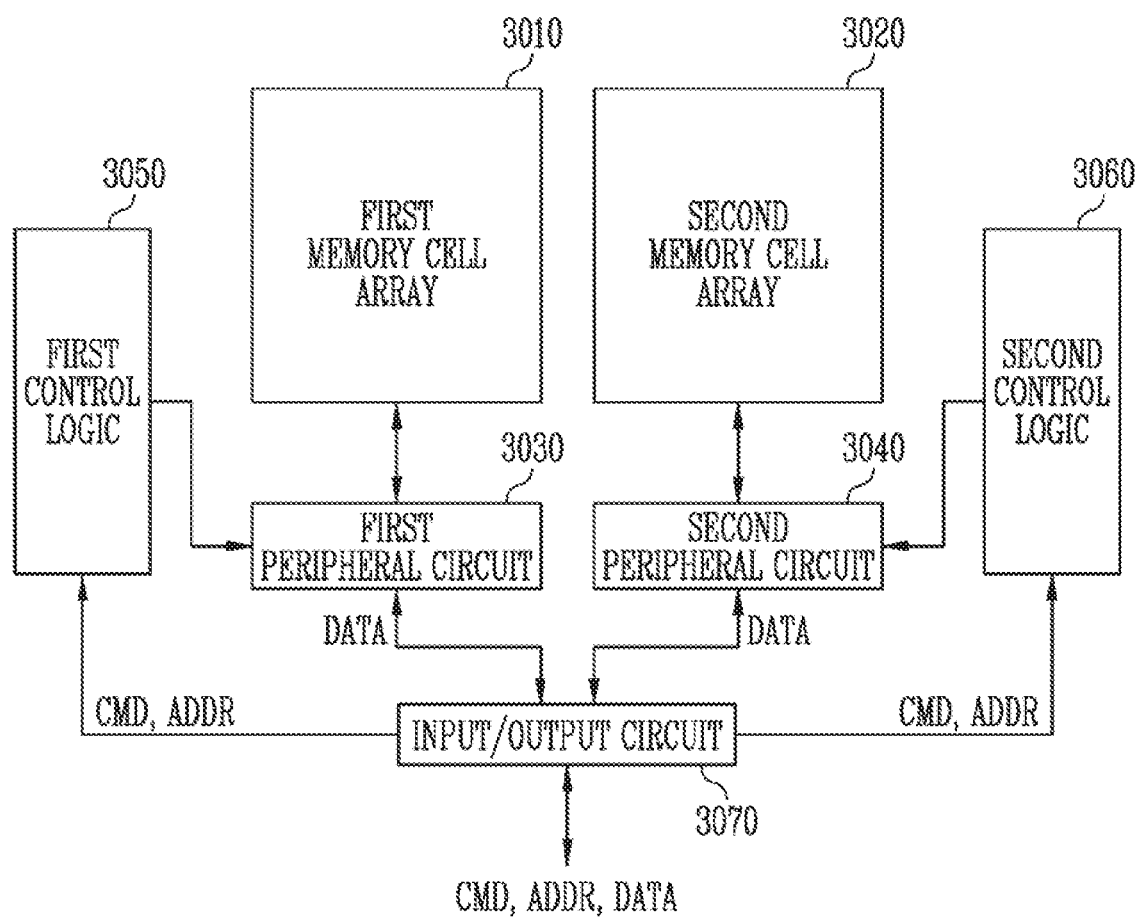
FIG. 3 is a diagram illustrating a plane interleaving operation.

FIG. 3 is a diagram illustrating a plane interleaving operation.

Referring to FIG. 3, a memory device 100_3 may include a first memory cell array 3010, a second memory cell array 3020, a first peripheral circuit 3030, a second peripheral circuit 3040, first control logic 3050, second control logic 3060, and an input/output circuit 3070. The first control logic may be implemented as hardware, software, or a combination of hardware and software. For example, the first control logic may be a first control logic circuit operating in accordance with an algorithm and/or a processor executing control logic code. The second control logic may be implemented as hardware, software, or a combination of hardware and software. For example, the second control logic may be a second control logic circuit operating in accordance with an algorithm and/or a processor executing control logic code.

The first control logic 3050 may receive a command and an address from the input/output circuit 3070 and generate a control signal for controlling the first peripheral circuit 3030 to perform an operation corresponding to the command on an area corresponding to the address in a storage area included in the first memory cell array 3010.

The second control logic 3060 may receive a command and an address from the input/output circuit 3070 and generate a control signal for controlling the second peripheral circuit 3040 to perform an operation corresponding to the command on an area corresponding to the address in a storage area included in the second memory cell array 3020.

In other words, since the first control logic 3050 and the second control logic 3060 may receive different addresses, an area where an operation is performed in the storage area included in the first memory cell array 3010 and an area where an operation is performed in the storage area included in the second memory cell array 3020 may be accessed by the different addresses.

The input/output circuit 3070 may receive data from the memory controller 200 and transfer the received data sequentially to the first peripheral circuit 3030 and the second peripheral circuit 3040. For example, the input/output circuit 3070 may receive first data and transfer the first data to the first peripheral circuit 3030 and may then receive second data and transfer the second data to the second peripheral circuit 3040.

The data transferred to the first peripheral circuit 3030 and the second peripheral circuit 3040 may be programmed independently by the first control logic 3050 and the second control logic 3060, respectively. For example, when the first data is transferred to the first peripheral circuit 3030, the first control logic 3050 might not wait for the second peripheral circuit 3040 to receive the second data. In other words, the first control logic 3050 may control the first peripheral circuit 3030 to program the first memory cell array 3010 with the first data regardless of whether the second data is transferred to the second peripheral circuit 3040. In the same manner, the second control logic 3060 may control the second peripheral circuit 3040 so that the second data may be programmed into the second memory cell array 3020 regardless of whether the first data is transferred to the first peripheral circuit 3030. For convenience of explanation, a program operation has been described. However, the embodiments are not limited thereto. During a read operation or an erase operation, the first control logic 3050 and the second control logic 3060 may operate independently of each other.

A method of performing a program operation, a read operation, or a read operation on the first memory cell array 3010 and the second memory cell array 3020 in an independent manner may be referred to as a plane interleaving scheme. In other words, according to the plane interleaving scheme, each of the control logics may independently control each of the plurality of peripheral circuits to perform a program operation, a read operation, or an erase operation in each of the plurality of memory cell arrays.

FIG. 4 is a diagram illustrating a multi-plane program operation.

Referring to FIG. 4, a first plane 410 may include a first memory cell array 411 and a first peripheral circuit 412, A second plane 420 may include a second memory cell array 421 and a second peripheral circuit 422. An input/output circuit 430 may transfer data to the first peripheral circuit 412 and the second peripheral circuit 422. The first peripheral circuit 412 and the second peripheral circuit 422 may be controlled by one control logic.

The input/output circuit 430 may transfer first data DATA1 to the first peripheral circuit 412. The input/output circuit 430 may transfer second data DATA2 to the second peripheral circuit 422. The first peripheral circuit 412 and the second peripheral circuit 422 may program memory cell arrays with the first data DATA1 and the second data DATA2, respectively, at the same time. In other words, the first peripheral circuit 412 may program the first memory cell array 411 with the first data DATA1 and at the same time, the second peripheral circuit 422 may program the second memory cell array 421 with the second data DATA2.

The first peripheral circuit 412 and the second peripheral circuit 422 may perform program operations by the same control logic. Therefore, data may be programmed into an area indicated by an address the control logic has received. For example, the control logic may receive a first address ADDR 1. The first peripheral circuit 412 may program the first data DATA1 into a storage area indicated by the first address ADDR 1 in a storage area included in the first memory cell array 411. The second peripheral circuit 422 may program the second data DATA2 into a storage area indicated by the first address ADDR 1 in a storage area included in the second memory cell array 421. In other words, since operations are performed on areas indicated by the same address, random program performance may be deteriorated. For convenience of explanation, a program operation is provided as an example. However, when a read operation or an erase operation is performed in a multi-plane scheme, random read performance and random erase performance may be deteriorated as well.

Referring to a graph of operating time and operating location, during a program operation, the input/output circuit 430 may perform an I/O operation of receiving data from the memory controller 200 and transferring the data to the peripheral circuits. For example, the input/output circuit 430 may receive the first data DATA1 from the memory controller 200 and transfer the first data DATA1 to the first peripheral circuit 412. After the first data DATA1 is transferred to the first peripheral circuit 412, the input/output circuit 430 may receive the second data DATA2 from the memory controller 200 and transfer the second data DATA2 to the second peripheral circuit 422.

When the first peripheral circuit 412 and the second peripheral circuit 422 receive the data, the control logic may control the first peripheral circuit 412 and the second peripheral circuit 422 so that the first data DATA1 and the second data DATA2 may be programmed into the first memory cell array 411 and the second memory cell array 421, respectively, at the same time. In other words, the first plane 410 may wait for a wait time tWAIT until the second peripheral circuit 422 receives the second data DATA2 after the first peripheral circuit 412 of the first plane 410 receives the first data DATA1. In an embodiment, the word 'same time' as used herein with respect to occurrences mean that the occurrences take place on overlapping intervals of time. For example, if a first occurrence takes place over a first interval of time and a second occurrence takes place at the same time over a second interval of time, then the first and second intervals at least partially overlap each other such that there exists a time at which the first and second occurrences are both taking place after the wait time tWAIT.

FIG. 5 is a diagram illustrating a program operation according to a plane interleaving scheme.

Referring to FIG. 5, a first plane 510 may include a first memory cell array 511 and a first peripheral circuit 512. A second plane 520 may include a second memory cell array 521 and a second peripheral circuit 522. An input/output circuit 530 may transfer data to the first peripheral circuit 512 and the second peripheral circuit 522, The first peripheral circuit 512 and the second peripheral circuit 522 may be controlled by a first control logic (not shown) and a second control logic (not shown), respectively.

The input/output circuit 530 may transfer the first data DATA1 to the first peripheral circuit 512. The input/output circuit 530 may transfer the second data DATA2 to the second peripheral circuit 522. The first peripheral circuit 512 and the second peripheral circuit 522 may program memory cell arrays with the first data DATA1 and the second data DATA2, respectively, at the same time. In other words, the second peripheral circuit 522 may program the second memory cell array 521 with the second data DATA2 regardless of an operation in which the first peripheral circuit 512 programs the first memory cell array 511 with the first data DATA1.

The first peripheral circuit 512 and the second peripheral circuit 522 may perform program operations by the first control logic (not shown) and the second control logic (not shown), respectively. Therefore, an address which the first control logic (not shown) receives from the memory controller 200 may be different from an address which the second control logic (not shown) receives from the memory controller 200. For example, the first control logic (not shown) may receive the first address ADDR 1 and the second control logic (not shown) may receive a third address ADDR 3.

The first peripheral circuit 512 may be controlled by the first control logic (not shown) and program the first data DATA1 into a storage area indicated by the first address ADDR 1 in a storage area included in the first memory cell array 511. The second peripheral circuit 522 may be controlled by the second control logic (not shown) and program the second data DATA2 into a storage area indicated by the third address ADDR 3 in a storage area included in the second memory cell array 521. In other words, since operations are performed on areas indicated by different addresses, random program performance may be improved. For convenience of explanation, a program operation is provided as an example. However, when a read operation or an erase operation is performed in a plane interleaving scheme, random read performance and random erase performance may be improved as well.

Referring to a graph of operating time and operating location, the input/output circuit 530 may perform an I/O operation of receiving data from the memory controller 200 and transferring the data to the peripheral circuits. For example, the input/output circuit 530 may receive the first data DATA1 from the memory controller 200 and transfer the first data DATA1 to the first peripheral circuit 512. After the first data DATA1 is transferred to the first peripheral circuit 512, the input/output circuit 530 may receive the second data DATA2 from the memory controller 200 and transfer the second data DATA2 to the second peripheral circuit 522.

When the first peripheral circuit 512 receives the first data DATA1, the first control logic (not shown) may control the first peripheral circuit 512 to program the first memory cell array 511 with the first data DATA1. When the second peripheral circuit 522 receives the second data DATA2, the second control logic (not shown) may control the second peripheral circuit 522 to program the second memory cell array 521 with the second data DATA2. That is, program operations may be independently performed on the first plane 510 and the second plane 520.

Contrary to the operating time as shown in FIG. 4, the first plane 510 may perform a program operation without waiting for the wait time tWAIT after receiving the first data DATA1, so that a program completion time for the first plane 510 may be reduced by the wait time tWAIT.

Figure 6:
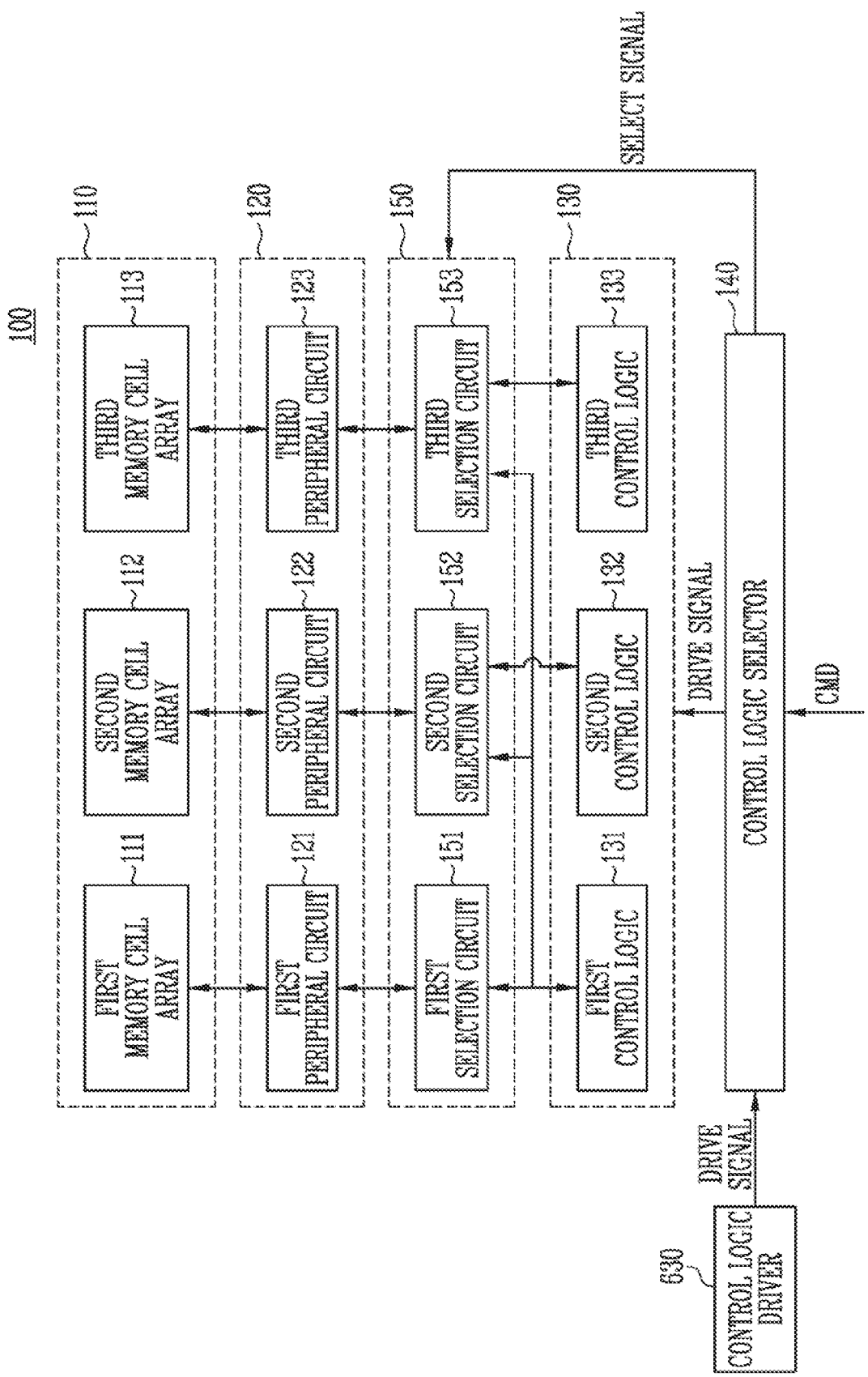
FIG. 6 is a diagram illustrating a memory device according to an embodiment.

FIG. 6 is a diagram illustrating the memory device 100 according to an embodiment.

Referring to FIG. 6, the memory device 100 may include the memory cell array group 110, the peripheral circuit group 120, the control logic group 130, the control logic selector 140, the signal selector 150, and a control logic driver 630.

The memory cell array group 110 may include first, second, and third memory cell arrays 111, 112, and 113. The peripheral circuit group 120 may include first, second, and third peripheral circuits 121, 122, and 123. The signal selector 150 may include first, second, and third selection circuits 151, 152, and 153. The control logic group 130 may include first, second, and third control logics 131, 132, and 133.

The first, second, and third control logics 131, 132, and 133 may control the first, second, and third peripheral circuits 121, 122, and 123, respectively. One of the first to third control logics 131 to 133 may be a common control logic. The common control logic may generate a common control signal which is commonly transferred to the first peripheral circuit 121 to the third peripheral circuit 123. According to an embodiment, the first control logic 131 may be a common control logic. The second control logic 132 and the third control logic 133 may be individual control logics. An individual control logic may generate an individual control signal which is transferred to one peripheral circuit selected from among a plurality of peripheral circuits. According to an embodiment, the second control logic 132 and the third control logic 133 may be individual control logics. The second control logic 132 may generate an individual control signal transferred to the second peripheral circuit 122. The third control logic 133 may generate an individual control signal transferred to the third peripheral circuit 123.

For convenience of explanation, the first control logic 131 may be the common control logic and the second and third control logics 132 and 133 may be the individual control logics. However, the embodiments are not limited thereto.

The control logic driver 630 may generate a drive signal transferred to the control logic group 130. The drive signal may be a power supply signal or a clock signal. For example, the control logic driver 630 may receive an external power supply from an external device and generate a power signal to be applied to each control logic. Alternatively, the control logic driver 630 may receive an external clock from an external device and generate a clock signal to be applied to each control logic.

The control logic selector 140 may receive a command from the memory controller 200 or an input/output circuit. The control logic selector 140 may determine a type of the received command. For example, the control logic selector 140 may determine whether the received command is to instruct an operation performed in a multi-plane scheme. Alternatively, the control logic selector 140 may determine whether the received command is to instruct an operation performed in a plane interleaving scheme.

The control logic selector 140 may selectively provide the drive signal from the control logic driver 630 to the first to third control logics 131 to 133. For example, the control logic selector 140 may selectively provide a power signal to the first to third control logics 131 to 133 using a power gating scheme. Alternatively, the control logic selector 140 may selectively provide a power signal to the first to third control logics 131 to 133 using a clock gating scheme.

The control logic selector 140 may selectively provide the drive signal to the first to third control logics 131 to 133 according to a type of the command received from the control logic driver 630. For example, when the received command is to instruct a multi-plane operation, the control logic selector 140 may activate the first control logic 131 by transferring the drive signal to the first control logic 131 and deactivate the second and third control logics 132 and 133. For example, when the received command is to instruct an operation performed in a plane interleaving scheme, the control logic selector 140 may activate the first and third control logics 131 and 133 by transferring the drive signal to the first and third control logics 131 and 133.

Current consumption may be reduced when a control logic does not receive a drive signal. In other words, the control logic selector 140 may reduce current consumption by selectively activating or deactivating a control logic according to a type of a command.

The first control logic 131 may transfer a common control signal to the second and third peripheral circuits 122 and 123 in addition to the first peripheral circuit 121. The second control logic 132 may transfer an individual control signal to the second peripheral circuit 122. The third control logic 133 may transfer an individual control signal to the third peripheral circuit 123. Therefore, when all first to third control logics 131 to 133 are activated, the second peripheral circuit 122 and the third peripheral circuit 123 may receive the common control signal and the individual control signals.

Therefore, the signal selector 150 may transfer one control signal among the common control signal and the individual control signals to the peripheral circuit.

The first selection circuit 151 may receive the common control signal from the first control logic 131 and transfer the common control signal to the first peripheral circuit 121. The second selection circuit 152 may receive the common control signal from the first control logic 131 and the individual control signal from the second control logic 132. The second selection circuit 152 may select one control signal between the received common control signal and the received individual control signal in response to a select signal, and may transfer the selected control signal to the second peripheral circuit 122. The third selection circuit 153 may receive the common control signal from the first control logic 131 and the individual control signal from the third control logic 133. The third selection circuit 153 may select one control signal between the received common control signal and the received individual control signal in response to a select signal, and may transfer the selected control signal to the third peripheral circuit 123.

The control logic selector 140 may generate a select signal according to the type of the command received from the memory controller 200. The control logic selector 140 may transfer the generated select signal to the signal selector 150. For example, when the type of the command corresponds to a command for instructing a multi-plane operation, the control logic selector 140 may generate a select signal so that the first to third selection circuits 151 to 153 may transfer the common control signal generated by the first control logic 131 to the first to third peripheral circuits 121 to 123, respectively. When the type of the command corresponds to a command for instructing an operation performed in a plane interleaving scheme, the control logic selector 140 may generate a select signal so that the first selection circuit 151 may transfer the common control signal generated by the first control logic 131 to the first peripheral circuit 121. The control logic selector 140 may generate a select signal so that the second selection circuit 152 may transfer the individual control signal generated by the second control logic 132 to the second peripheral circuit 122. The control logic selector 140 may generate a select signal so that the third selection circuit 153 may transfer the individual control signal generated by the third control logic 133 to the third peripheral circuit 123.

The first to third peripheral circuits 121 to 123 may control the first to third memory cell arrays 111 to 113 included in the memory cell array group 110, respectively, in response to the control signal received from the signal selector 150.

According to an embodiment, by deactivating some of the first to third control logics 131 to 133 according to the type of the command, current consumption by a control logic which is not used during an operation corresponding to the type of the command may be reduced.

Figure 7:
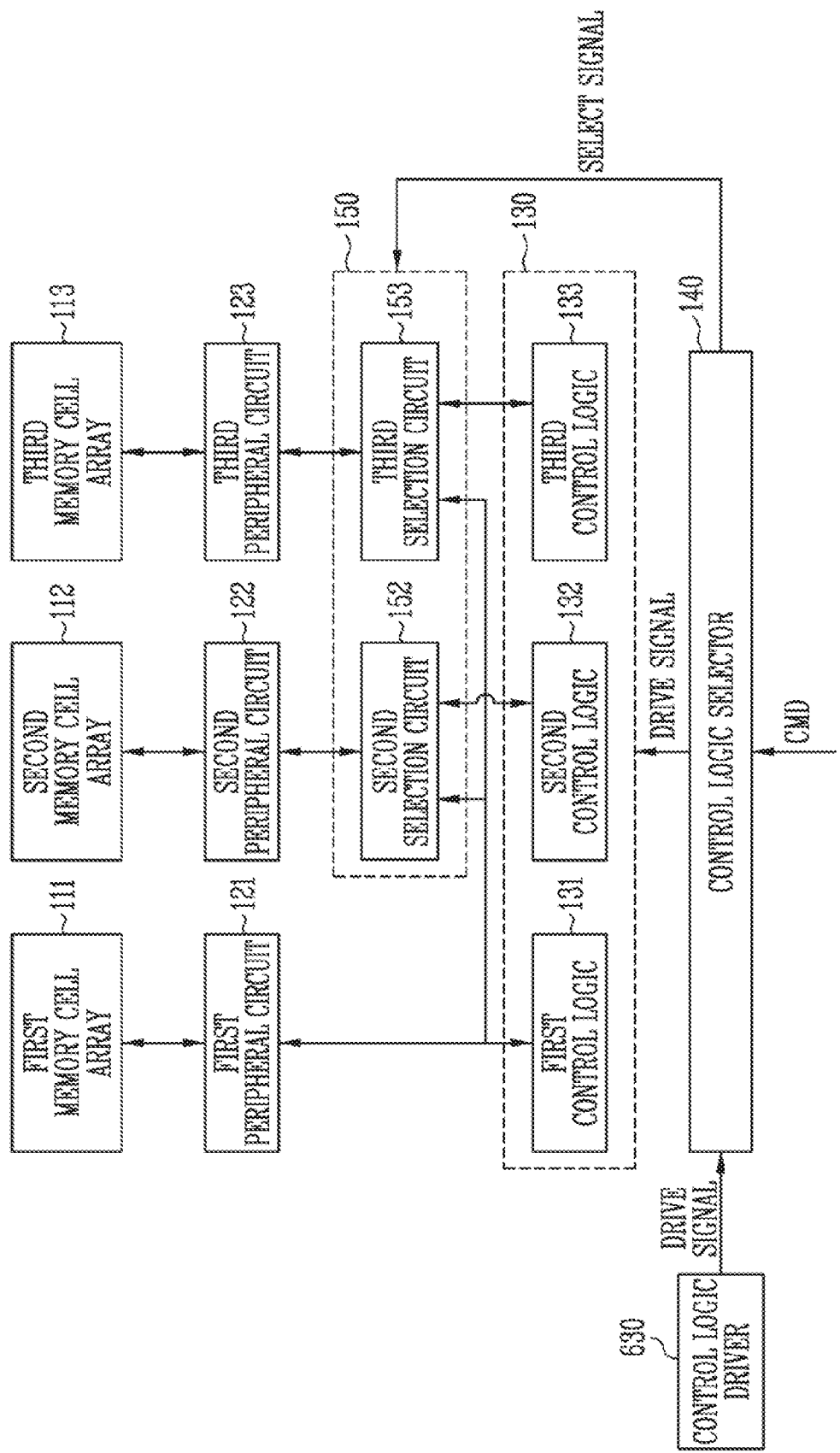
FIG. 7 is a diagram illustrating a memory device according to another embodiment.

FIG. 7 is a diagram illustrating a memory device according to another embodiment.

Referring to FIG. 7, apart from FIG. 6, the signal selector 150 might not include the first selection circuit 151. The first peripheral circuit 121 may receive the common control signal generated by the first control logic 131 regardless of the type of the command. On the other hand, according to the type of the command, the second peripheral circuit 122 and the third peripheral circuit 123 may receive the common control signal generated by the first control logic 131, or the individual control signals generated by the second control logic 132 and the third control logic 133. Thus, the signal selector 150 may include only the second selection circuit 152 and the third selection circuit 153. Therefore, it may be possible to design a memory device having a smaller size that the memory device shown in FIG. 6.

Figure 8:
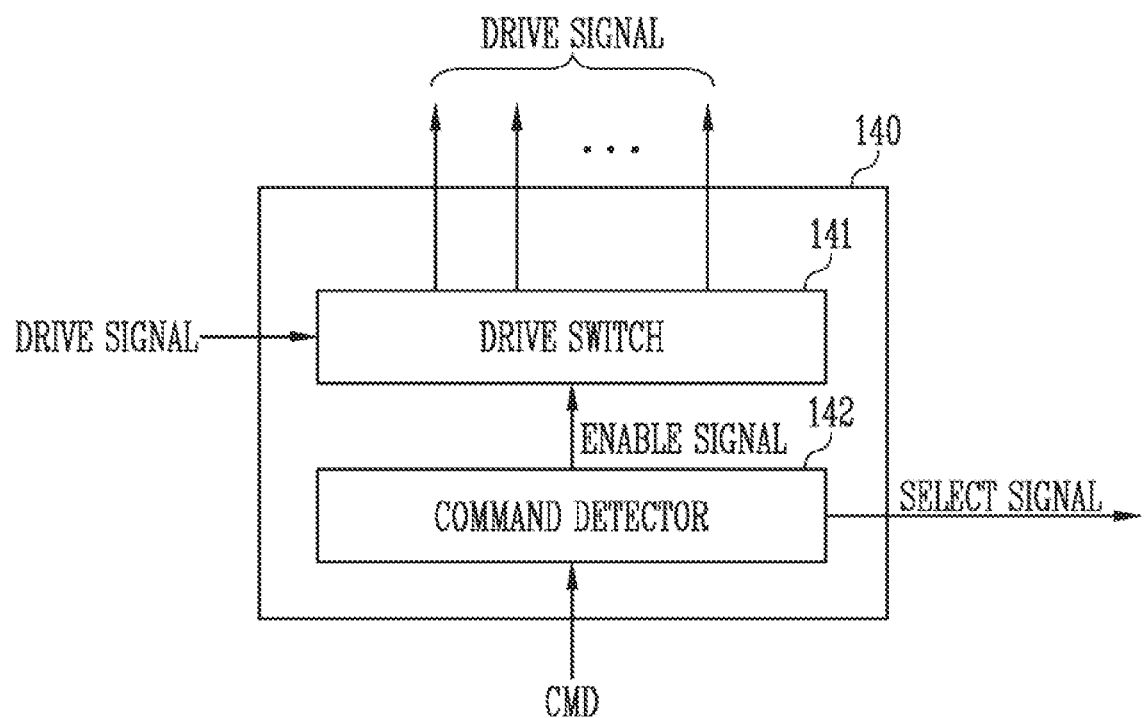
FIG. 8 is a diagram illustrating a control logic selector.

FIG. 8 is a diagram illustrating the control logic selector 140.

Referring to FIG. 8, the control logic selector 140 may include a drive switch 141 and a command detector 142.

The command detector 142 may receive a command from the memory controller 200. The command detector 142 may determine a type of the received command. Alternatively, the command detector 142 may determine the number of control logics used to perform an operation corresponding to the received command. For example, the command detector 142 may determine whether the received command is to instruct an operation performed in a plane interleaving scheme. For example, the command detector 142 may determine whether the received command is to instruct an operation performed in a multi-plane scheme.

The command detector 142 may generate an enable signal to be provided to the drive switch 141 according to the type of the command. For example, when the command received from the memory controller 200 is to instruct an operation performed in a plane interleaving scheme, the command detector 142 may generate an enable signal to activate a common control logic and an individual control logic. When the command received from the memory controller 200 is to instruct an operation performed in a multi-plane scheme, the command detector 142 may generate an enable signal to activate a common control logic and deactivate an individual control logic.

The command detector 142 may generate a select signal to be provided to the drive switch 141 according to the type of the command. For example, when the command received from the memory controller 200 is to instruct an operation performed in a plane interleaving scheme, the command detector 142 may generate a select signal so that the first peripheral circuit 121 receives a common control signal and the second and third peripheral circuits 122 and 123 may receive individual control signals. For example, when the command received from the memory controller 200 is to instruct an operation performed in a multi-plane scheme, the command detector 142 may generate a select signal so that the first to third peripheral circuits 121 to 123 receive the common control signal.

The drive switch 141 may receive a drive signal from the control logic driver 630 and selectively provide the drive signal to the control logic group 130. The drive switch 141 may receive the enable signal from the command detector 142 and selectively provide the drive signal to the control logic group 130 in response to the enable signal. For example, when the command received from the memory controller 200 is to instruct an operation performed in a plane interleaving scheme, the command detector 142 may generate an enable signal so that the first to third control logics 131 to 133 may receive the drive signal. In other words, the first to third control logics 131 to 133 may be activated. When the command received from the memory controller 200 is to instruct an operation performed in a multi-plane scheme, the command detector 142 may generate an enable signal so that the first control logic 131 may be activated and the second and third control logics 132 and 133 may be deactivated.

Figure 9:
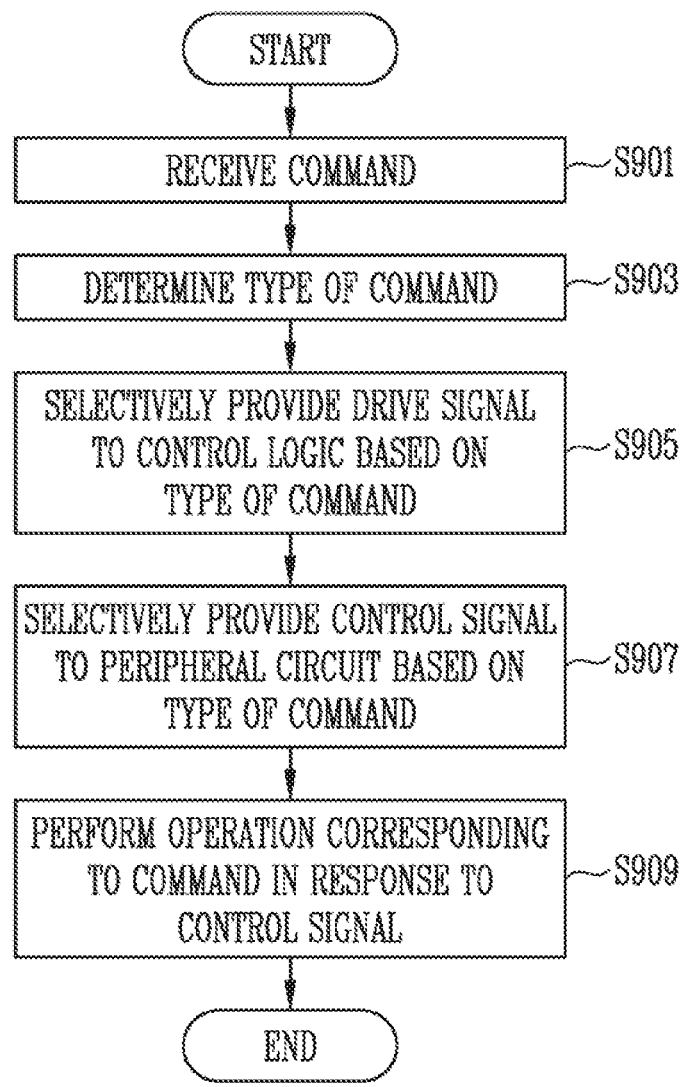
FIG. 9 is a diagram illustrating a method of operating a memory device.

FIG. 9 is a diagram illustrating a method of operating the memory device 100.

Referring to FIG. 9, at step S901, the control logic selector 140 may receive a command from the memory controller 200. The command may be a program command, a read command, or an erase command. The command may be to instruct an operation performed in a plane interleaving scheme, or an operation performed in a multi-plane scheme.

At step S903, the control logic selector 140 may determine a type of the received command. In other words, the control logic selector 140 may determine whether the received command is to instruct an operation performed in a plane interleaving scheme, or an operation performed in a multi-plane scheme.

At step S905, the control logic selector 140 may selectively provide a drive signal to a plurality of control logics according to the type of the received command. For example, when operations are performed on a plurality of planes at the same time, the drive signal may be provided to the common control logic. When the operations are separately performed on the plurality of planes, the drive signal may be provided to the common control logic and the individual control logics.

At step S907, the signal selector 150 may selectively provide a control signal to a peripheral circuit according to a select signal generated based on the type of the command. For example, when operations are performed on a plurality of planes, the common control signal received from the common control logic may be provided to a plurality of peripheral circuits. When the operations are separately performed on the plurality of planes, one of the common control signal received from the common control logic and the individual control signals received from the individual control logics may be provided to the peripheral circuit.

At step S909, the peripheral circuit group 120 may perform an operation corresponding to the command in response to the common control signal or the individual control signal received from the signal selector 150. For example, operations may be performed a plurality of planes concurrently, or separately.

According to a method of operating a memory device, since a drive signal is selectively provided to control logics according to a type of a command, current consumption caused by a control logic which is not used may be reduced.

Figure 10:
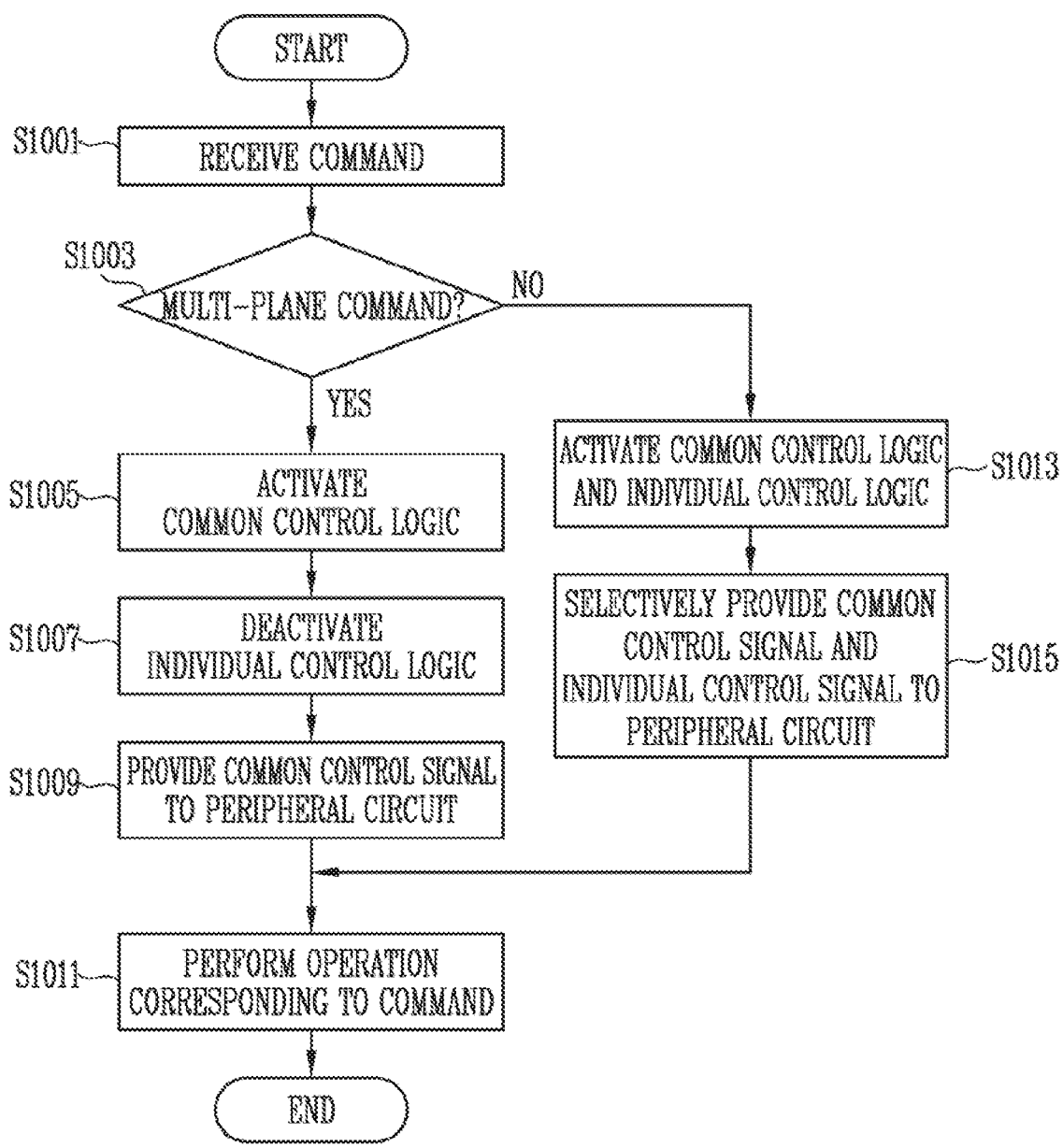
FIG. 10 is a diagram illustrating a method of operating a memory device.

FIG. 10 is a diagram illustrating a method of operating the memory device 100.

Referring to FIG. 10, at step S1001, the control logic selector 140 may receive a command from the memory controller 200. The command may be a program command, a read command, or an erase command. The command may be to instruct an operation performed in a plane interleaving scheme, or an operation performed in a multi-plane scheme.

At step S1003, the control logic selector 140 may determine whether the received command is to instruct an operation performed in a multi-plane scheme, i.e., a multi-plane command. Alternatively, the control logic selector 140 may determine whether the received command is to instruct an operation performed in a plane interleaving scheme, i.e., a plane interleaving command. When the received command is the multi-plane command, the process flow may proceed to step S1013.

At step S1005, the control logic selector 140 may activate a common control logic. The common control logic may be a control logic that generates a common control signal to be provided to a plurality of peripheral circuits. In other words, the common control logic may control the plurality of peripheral circuits. The control logic selector 140 may receive a drive signal from the control logic driver 630 and transfer the drive signal to the common control logic to thereby activate the common control logic. The drive signal may be a power signal or a clock signal.

At step S1005, the control logic selector 140 may activate the common control logic. The common control logic may be a control logic that generates a common control signal to be provided to a plurality of peripheral circuits. In other words, the common control logic may control the plurality of peripheral circuits. The control logic selector 140 may receive the drive signal from the control logic driver 630 and transfer the drive signal to the common control logic to thereby activate the common control logic. The drive signal may be a power signal or a clock signal.

At step S1007, the control logic selector 140 may activate individual control logics. The individual control logics may be control logics that generate individual control signals to be provided to the plurality of peripheral circuits, respectively. In other words, each of the individual control logics may control one peripheral circuit selected from among the peripheral circuits. The control logic selector 140 may receive the drive signal from the control logic driver 630 and might not transfer the drive signal to the individual control logics to thereby deactivate the individual control logics.

At step S1009, the signal selector 150 may provide the common control signal received from the common control logic to the plurality of peripheral circuits. The signal selector 150 may select the common control signal between the common control signal and the individual control signals and provide the selected common control signal to the plurality of peripheral circuits.

At step S1013, the control logic selector 140 may activate the common control logic and the individual control logics. The control logic selector 140 may receive the drive signal from the control logic driver 630 and transfer the drive signal to the common control logic and the individual control logics to thereby activate the common control logic and the individual control logics. The drive signal may be a power signal or a clock signal.

At step S1015, the signal selector 150 may selectively provide the common control signal and the individual control signals to the peripheral circuit. For example, the signal selector 150 may select a control signal in response to the select signal received from the control logic selector 140. For example, when the received command is the plane interleaving command, the signal selector 150 may transfer the individual control signals to the peripheral circuit.

According to a method of operating a memory device, since a drive signal is selectively provided to control logics according to a type of a command, current consumption caused by a control logic which is not used may be reduced.

Figure 11:
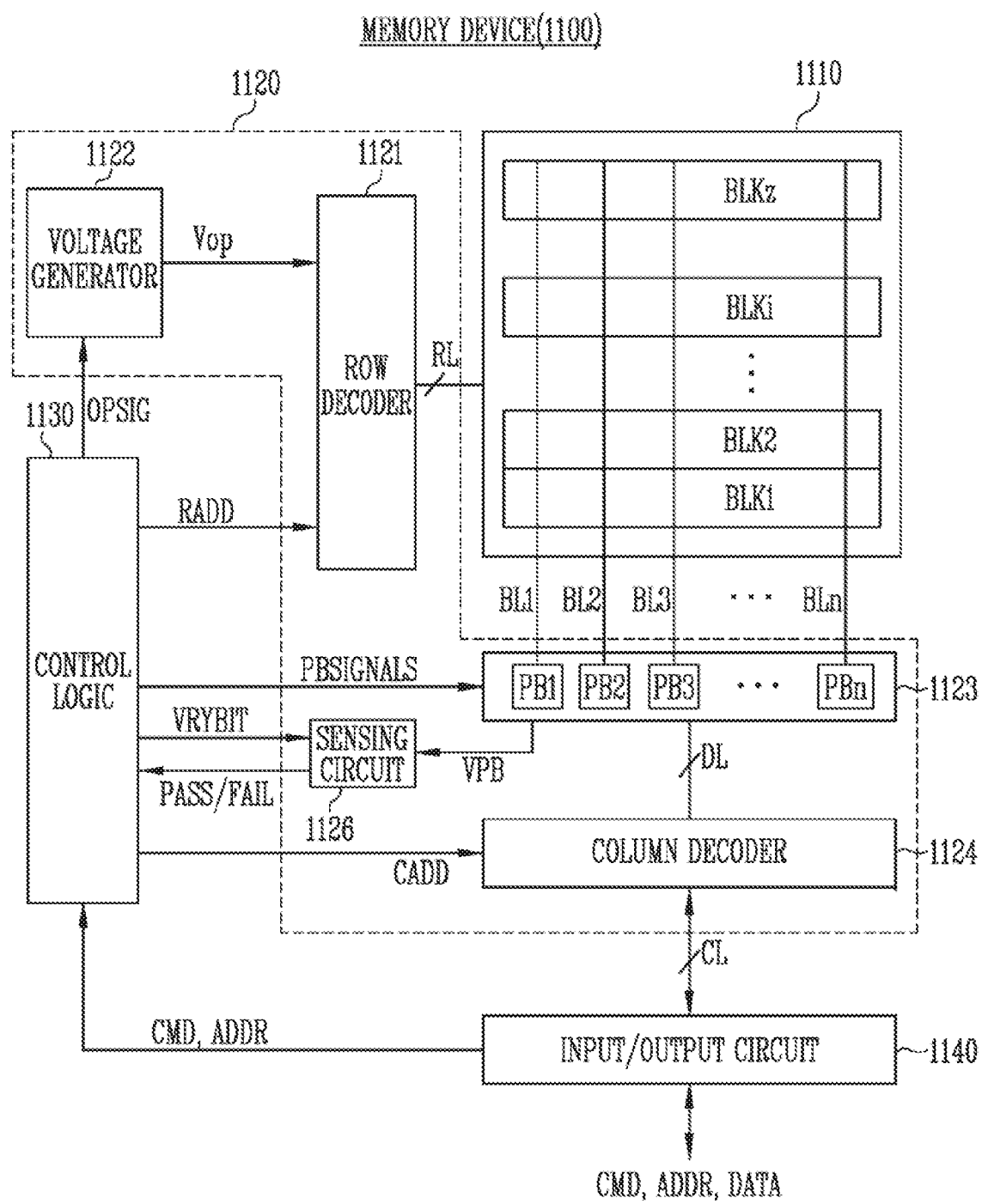
FIG. 11 is a diagram illustrating a memory device according to an embodiment.

FIG. 11 is a diagram illustrating a memory device 1100 according to an embodiment.

Referring to FIG. 11, the memory device 1100 may include a memory cell array 1110, a peripheral circuit 1120 and a control logic 1130.

The memory cell array 1110 may include a plurality of memory blocks BLK1 to BLKz. The plurality of memory blocks BLK1 to BLKz may be coupled to a row decoder 1121 through row lines RL. The memory blocks BLK1 to BLKz may be coupled to a page buffer group 1123 through bit lines BL1 to BLm, Each of the plurality of memory blocks BLK1 to BLKz may include a plurality of memory cells. According to an embodiment, the plurality of memory cells may be non-volatile memory cells. Memory cells coupled to the same word line may be defined as one page, Therefore, each memory block may include a plurality of pages.

The row lines RL may include at least one source select line, a plurality of word lines, and at least one dram select line.

Each of the memory cells included in the memory cell array 1110 may include a single-level cell (SLC) storing a single data bit, a multi-level cell (MLC) storing two data bits, a triple-level cell (TLC) storing three data bits, or a quad-level cell (QLC) storing four data bits.

The peripheral circuit 1120 may be configured to perform program, read and erase operations on the selected area of the memory cell array 1110 in response to control of the control logic 1130. The peripheral circuit 1120 may drive the memory cell array 1110, For example, the peripheral circuit 1120 may apply various operating voltages to the row lines RL and bit lines BL1 to BLn, or may discharge the applied voltages in response to control of the control logic 1130.

The peripheral circuit 1120 may include the row decoder 1121, a voltage generator 1122, the page buffer group 1123, a column decoder 1124, and an input/output circuit 1140.

The row decoder 1121 may be coupled to the memory cell array 1110 through the row lines RL. The row lines RL may include at least one source select line, a plurality of word lines, and at least one drain select line. According to an embodiment, the word lines may include normal word lines and dummy word lines. According to an embodiment, the row lines RL may further include a pipe select line.

The row decoder 1121 may be configured to operate in response to control of the control logic 1130. The row decoder 1121 may receive a row address RADD from the control logic 1130.

The row decoder 1121 may be configured to decode the row address RADD. The row decoder 1121 may select at least one memory block among the memory blocks BLK1 to BLKz according to the decoded block address. The row decoder 1121 may select at least one word line from the selected memory block so as to apply voltages generated by the voltage generator 1122 to at least one word line according to the decoded address.

For example, during a program operation, the row decoder 1121 may apply a program voltage to the selected word line and a program pass voltage having a lower voltage level than the program voltage to unselected word lines. During a program verify operation, the row decoder 1121 may apply a verify voltage to the selected word line and a verify pass voltage greater than the verify voltage to the unselected word lines. During a read operation, the row decoder 1121 may apply a read voltage to the selected word line and a read pass voltage greater than the read voltage to the unselected word lines.

According to an embodiment, an erase operation of the memory cell array 1110 may be performed in unit of memory blocks. During an erase operation, the row decoder 1121 may select one of the memory blocks according to the decoded address. During the erase operation, the row decoder 1121 may apply a ground voltage to word lines coupled to the selected memory block.

The voltage generator 1122 may be controlled by the control logic 1130. The voltage generator 1122 may be configured to generate a plurality of voltages by using an external power voltage supplied to the memory device 1100. For example, the voltage generator 1122 may generate various operating voltages Vop for program, read and erase operations in response to an operation signal OPSIG. For example, the voltage generator 1122 may generate a program voltage, a verify voltage, a pass voltage, a read voltage, and an erase voltage in response to the control of the control logic 1130.

According to an embodiment, the voltage generator 1122 may generate an internal power voltage by regulating an external power voltage. The internal power voltage generated by the voltage generator 1122 may serve as an operating voltage of the memory cell array 1110.

According to an embodiment, the voltage generator 1122 may generate a plurality of voltages by using the external power voltage or the internal power voltage.

For example, the voltage generator 1122 may include a plurality of pumping capacitors receiving the internal power voltage and generate a plurality of voltages by selectively activating the plurality of pumping capacitors in response to the control of the control logic 1130.

The plurality of generated voltages may be supplied to the memory cell array 1110 by the row decoder 1121.

The page buffer group 1123 may include first to nth page buffers PB1 to PBn. The first to nth page buffers PB1 to PBn may be coupled to the memory cell array 1110 through the first to nth bit lines BL1 to BLn, respectively. The first to nth page buffers PB1 to PBn may operate in response to the control of the control logic 1130. For example, the first to nth page buffers PB1 to PBn may operate in response to page buffer control signals PBSIGNALS. For example, the first to nth page buffers PB1 to PBn may temporarily store data received through the first to nth bit lines BL1 to BLn, or may sense voltages or currents in the first to nth bit lines BL1 to BLn during a read or verify operation.

For example, during a program operation, the first to nth page buffers PB1 to PBn may transfer data DATA received through the input/output circuit 1140 to selected memory cells through the first to nth bit lines BL1 to BLn when a program pulse is applied to a selected word line during a program operation. Memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained. During a program verify operation, the first to nth page buffers PB1 to PBn may read page data from the selected memory cells through the first to nth bit lines BL1 to BLn, respectively.

During a read operation, the first to nth page buffers PB1 to PBn may read the data DATA from the memory cells of the selected page through the first to nth bit lines BL1 to BLn and output the read data DATA to the data input/output circuit 1125 in response to control of the column decoder 1124.

During an erase operation, the first to nth page buffers PB1 to PBn may float the first to nth bit lines BL1 to BLn.

The column decoder 1124 may transfer data between the input/output circuit 1140 and the page buffer group 1123 in response to a column address CADD. For example, the column decoder 1124 may exchange data with the first to nth page buffers PB1 to PBn through data lines DL, or may exchange data with the input/output circuit 1140 through column lines CL.

The input/output circuit 1140 may transfer the command CMD and the address ADD from the memory controller 200 described above with reference to FIG. 1 to the control logic 1130, or may exchange the data DATA with the column decoder 1124.

A sensing circuit 1126 may generate a reference current in response to an allowable bit signal VRYBIT and compare a sensing voltage VPB received from the page buffer group 1123 with a reference voltage generated by the reference current to output a pass signal PASS or a fail signal FAIL during a read operation or a verify operation.

The control logic 1130 may control the peripheral circuit 1120 by outputting the operation signal OPSIG, the row address RADD, the page buffer control signals PBSIG-NALS and the allowable bit signal VRYBIT in response to the command CMD and the address ADD. Further, the control logic 1130 may determine whether a verify operation has passed or failed in response to the pass signal PASS or the fail signal FAIL.

For convenience of explanation, one memory cell array 1110 is illustrated. However, the memory device 1100 may include a plurality of memory cell arrays. For example, as shown in FIGS. 6 and 7, the memory device 1100 may include the memory cell array group 110. The memory cell array group 110 may include the first, second, and third memory cell arrays 111, 112, and 113.

For convenience of explanation, one peripheral circuit 1120 is illustrated. However, the memory device 1100 may include a plurality of peripheral circuits. For example, as shown in FIGS. 6 and 7, the memory device 1100 may include the peripheral circuit group 120. The peripheral circuit group 120 may include the first, second, and third peripheral circuits 121, 122, and 123.

For convenience of explanation, one control logic 1130 is illustrated. However, the memory device 1100 may include a plurality of control logics. For example, as shown in FIGS. 6 and 7, the memory device 1100 may include the control logic group 130, The control logic group 130 may include the first, second, and third control logics 131, 132, and 133.

The input/output circuit 1140 may include the control logic selector 140 and the control logic driver 630. The input/output circuit 110 may receive a command and transfer the command to the control logic selector 140. The control logic selector 140 may selectively activate the plurality of control logics. For example, the control logic selector 140 may selectively the common control logic or the individual control logics. The input/output circuit 1140 may include the signal selector 150. The signal selector 150 may selectively transfer a common control signal generated by the common control logic or individual control signals generated by the individual control logics to the peripheral circuit group 120 according to the select signal received from the control logic selector 140.

Figure 12:
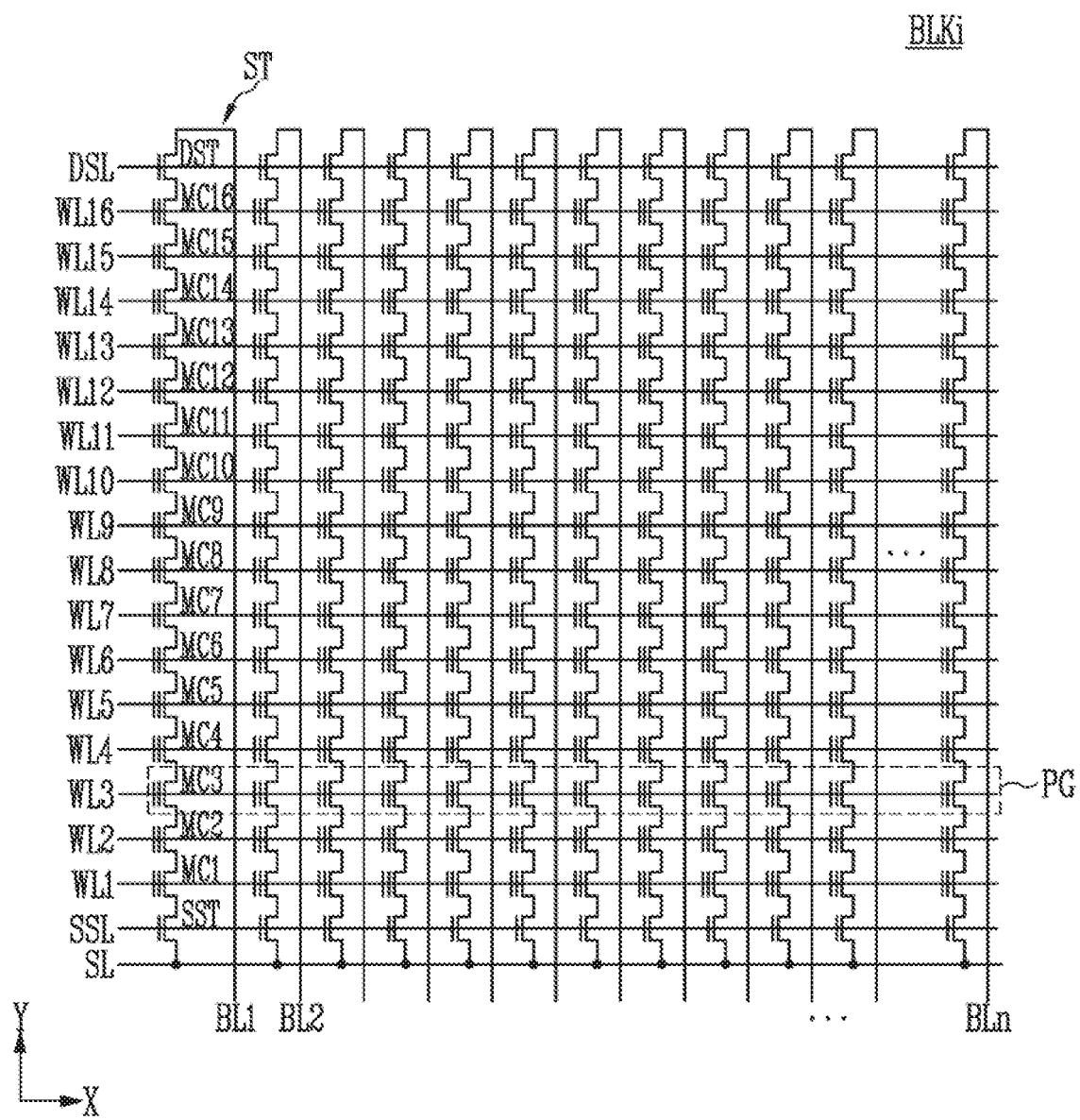
FIG. 12 is a diagram illustrating a memory block BLKi of FIG. 11.

FIG. 12 is a diagram illustrating a memory block BLKi of FIG. 11.

Referring to FIG. 12, the memory block BLKi may be coupled to a plurality of word lines arranged in parallel between a first select line and a second select line. The first select line may be a source select line SSL and the second select line may be a drain select line DSL. Specifically, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. Since the strings ST may have the same configuration, the string ST coupled to the first bit line BL1 will be described by way of example.

The string ST may include a source select transistor SST, a plurality of memory cells MC1 to MC16, and a drain select transistor DST coupled in series between the source line SL and the first bit line BL1. Each string ST may include at least one source select transistor SST, at least one drain select transistor DST, and more memory cells than the memory cells MC1 to MC16 as shown in FIG. 3.

A source of the source select transistor SST may be coupled to the source line SL and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells MC1 to MC16 may be coupled to a plurality of word lines WL1 to WL16. A group of memory cells coupled to the same word line, among memory cells included in different strings ST, may be referred to as a physical page PG. Therefore, the memory block BLKi may include as many physical pages PG as the number of the word lines WL1 to WL16.

A single memory cell may store one bit of data. This memory cell is generally called a single level cell (SLC). One physical page PPG may store one logical page (LPG) data. One LPG data may include as many data bits as the number of cells included in one physical page PG.

In addition, a single memory cell may store two or more bits of data. One physical page PG may store data corresponding to two or more logical pages LPG.

Figure 13:
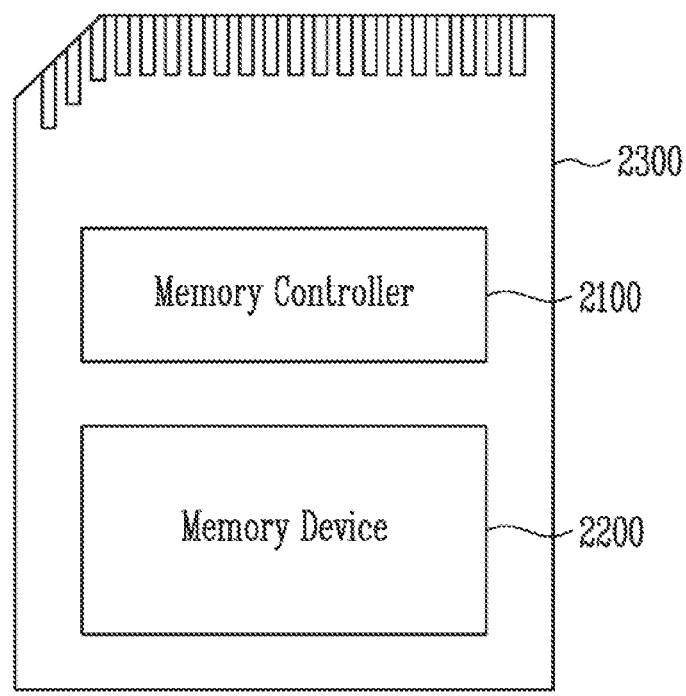
FIG. 13 is a block diagram illustrating a memory card system to which a storage device according to an embodiment is applied.

FIG. 13 is a block diagram illustrating an example of a memory card system 2000 to which a storage device according to an embodiment of the present disclosure is applied.

Referring to FIG. 13, the memory card system 2000 may a memory controller 2100, a memory device 2200 and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200.

In an embodiment, the memory controller 2100 may include components, such as a Random Access Memory (RAM), a processing unit, a host interface, a memory interface, and an ECC block.

The memory controller 2100 may communicate with an external device through the connector 2300. The memory controller 2100 may communicate with an external device (e.g., host) based on a communication protocol. For example, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and non-volatile memory express (NVMe) protocols. For example, the connector 2300 may be defined by at least one of the above-described various communication protocols.

In an embodiment, the memory device 2200 may be embodied as any of various non-volatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin-Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), an SD card (SD, miniSD, microSD, or SDHC), a universal flash storage (UFS), and the like.

Figure 14:
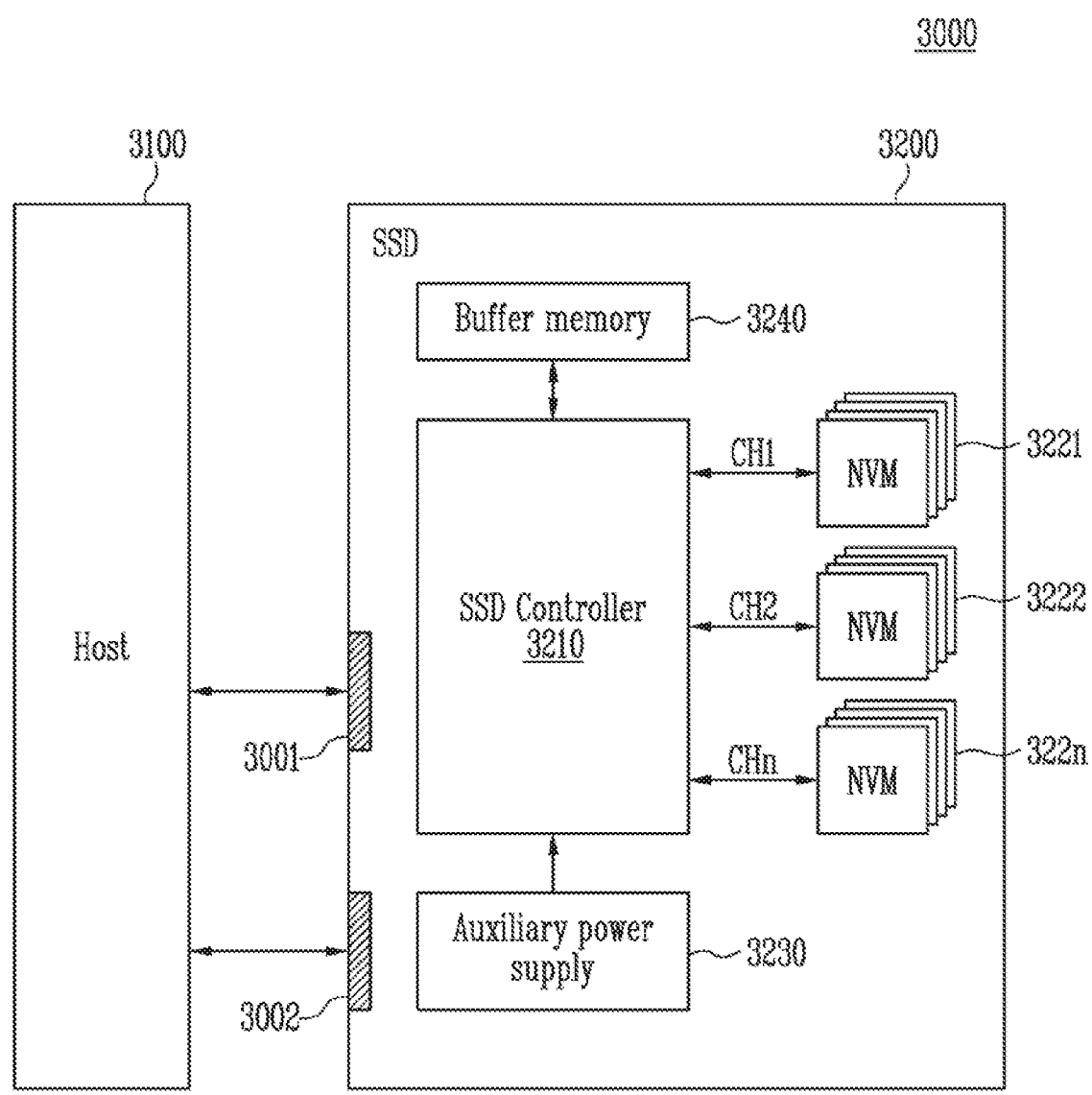
FIG. 14 is a block diagram illustrating an example of a solid state drive (SSD) system to which a storage device according to an embodiment of the present disclosure is applied.

FIG. 14 is a block diagram illustrating an example of a solid state drive (SSD) system 3000 to which a storage device according to an embodiment of the present disclosure is applied.

Referring FIG. 14, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG.

The SSD controller 3210 may control the plurality of flash memories 3221 to 322n in response to the signals SIG received from the host 3100. According to an embodiment, the signals SIG may be signals based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and non-volatile memory express (NVMe) interfaces.

The auxiliary power supply 3230 may be coupled to the host 3100 through the power connector 3002. The auxiliary power supply 3230 may be supplied and charged with the power PWR from the host 3100. The auxiliary power supply 3230 may supply the power of the SSD 3200 when power is not smoothly supplied from the host 3100. For example, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or non-volatile memories such as FRAM, ReRAM, STT-MRAM, and PRAM.

Figure 15:
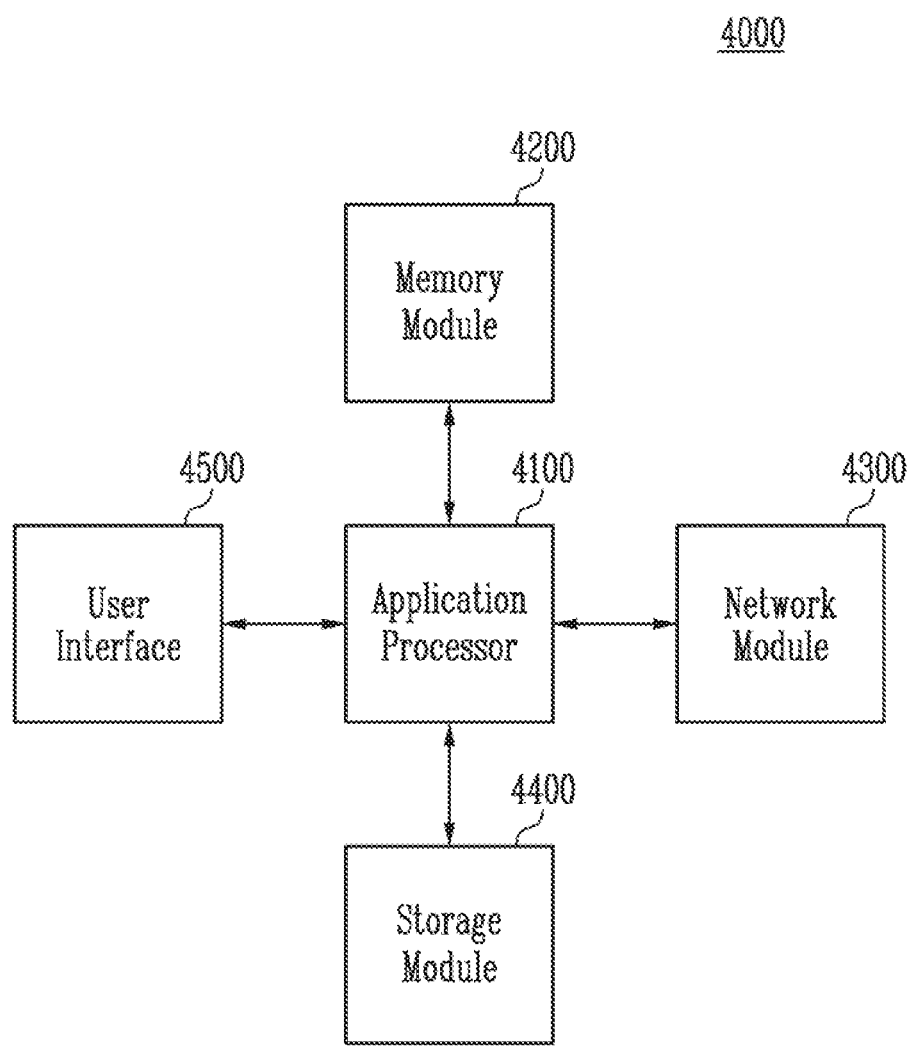
FIG. 15 is a block diagram illustrating a user system to which a storage device according to an embodiment is applied.

FIG. 15 is a block diagram illustrating a user system to which a storage device according to an embodiment is applied.

Referring to FIG. 15, a user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR3 SDRAM, and LPDDR3 SDRAM or non-volatile RAMs such as PRAM, ReRAM, MRAM, and FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. For example, the storage module 4400 may be embodied as a non-volatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. For example, the storage module 4400 may be provided as a removable storage medium (i.e., removable drive), such as a memory card or an external drive of the user system 4000.

For example, the storage module 4400 may include a plurality of non-volatile memory devices, and the plurality of non-volatile memory devices may operate in the same manner as the memory device described above with reference to FIGS. 10 to 13. The storage module 4400 may operate in the same manner as the storage device 50 described above with reference to FIG.

The user interface 4500 may include interfaces which input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to an embodiment, a memory device and a method of operating the memory device may provide improved current consumption management performance.

It will be apparent to those skilled in the art that various modifications can be made to any of the above-described embodiments without departing from the spirit or scope of the disclosure. Thus, it is intended that the embodiments cover all such modifications provided they come within the scope of the appended claims and their equivalents.

What is claimed is:

1. A memory device, comprising:
a plurality of memory cell arrays each including a plurality of memory cells;
a plurality of peripheral circuits each configured to perform operations on the plurality of memory cell arrays;
a plurality of control logics comprising a common control logic, and individual control logics; and
a control logic selector configured to activate the common control logic to control the plurality of peripheral circuits, or activate the plurality of control logics to respectively control the plurality of peripheral circuits according to a type of a command received from a memory controller.

2. The memory device of claim 1, wherein
each of the individual control logics is configured to control a corresponding peripheral circuit from among the plurality of peripheral circuits.

3. The memory device of claim 2, further comprising a signal selector selectively transferring a common control signal generated by the common control logic and individual control signals generated by the individual control logics to the plurality of peripheral circuits.

4. The memory device of claim 2, wherein the control logic selector activates the common control logic when the command is a first type of command.

5. The memory device of claim 4, wherein the control logic selector deactivates the individual control logics when the command is the first type of command.

6. The memory device of claim 5, wherein the first type of command instructs the operations to be performed on the plurality of memory cell arrays at the same time.

7. The memory device of claim 3, wherein the control logic selector activates the common control logic and the individual control logics when the command is a second type of command, and
wherein the signal selector selectively provides one of the common control signal generated by the common control logic and the individual control signals generated by the individual control logics to the plurality of peripheral circuits.

8. The memory device of claim 7, wherein the second type of command instructs the operations to be separately performed on the plurality of memory cell arrays.

9. The memory device of claim 1, further comprising:
a command detector determining a type of the command received from the memory controller; and
a drive switch selectively providing a drive signal to the plurality of control logics according to the type of the command.

10. The memory device of claim 9, wherein the drive signal is at least one of a power signal and a clock signal applied to the plurality of control logics.

11. A method of operating a memory device including a plurality of peripheral circuits controlling a plurality of memory cell arrays, the method comprising:
determining a type of a command received from a host; and
selectively activating a plurality of control logics to control the plurality of peripheral circuits, or activating a common control logic included in the plurality of peripheral circuits to control the plurality of peripheral circuits, based on the type of the command.

12. The method of claim 11, wherein the plurality of control logics comprises the common control logic commonly controlling the plurality of peripheral circuits and individual control logics individually controlling the plurality of peripheral circuits.

13. The method of claim 12, further comprising selectively transferring a common control signal generated by the common control logic and individual control signals generated by the individual control logics to the plurality of peripheral circuits.

14. The method of claim 12, wherein the selectively activating of the plurality of control logics comprises activating the common control logic and deactivating the individual control logics in response to information indicating that the command is a first type of command.

15. The method of claim 14, wherein the first type of command instructs operations to be performed on the plurality of memory cell arrays at the same time.

16. The method of claim 12, wherein the selectively activating of the plurality of control logics comprises activating the common control logic and the individual control logics in response to information indicating that the command is a second type of command.

17. The method of claim 16, further comprising providing a control signal selected according to the information indicating that the command is the second type of command among a common control signal generated by the common control logic and individual control signals generated by the individual control logics.

18. The method of claim 16, wherein the second type of command instructs operations to be separately performed on the plurality of memory cell arrays.

19. The method of claim 11, wherein the selectively activating of the plurality of control logics comprises selectively providing a drive signal to the plurality of control logics.

20. The method of claim 19, wherein the drive signal is at least one of a power signal and a clock signal applied to the plurality of control logics.

* * * * *